United States Patent
Chen et al.

(10) Patent No.: US 7,417,897 B2
(45) Date of Patent: Aug. 26, 2008

(54) METHOD FOR READING A SINGLE-POLY SINGLE-TRANSISTOR NON-VOLATILE MEMORY CELL

(75) Inventors: Hsin-Ming Chen, Tainan Hsien (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 87 days.

(21) Appl. No.: 11/625,829

(22) Filed: Jan. 23, 2007

(65) Prior Publication Data

US 2007/0247902 A1  Oct. 25, 2007

Related U.S. Application Data

(60) Provisional application No. 60/745,193, filed on Apr. 20, 2006.

(51) Int. Cl.
*G11C 11/34* (2006.01)
(52) U.S. Cl. .............. 365/185.18; 365/185.27
(58) Field of Classification Search ............ 365/185.27, 365/185.18
See application file for complete search history.

(56) References Cited

U.S. PATENT DOCUMENTS

| | | | |
|---|---|---|---|
| 5,761,126 A | 6/1998 | Chi et al. | |
| 5,808,936 A * | 9/1998 | Nakayama | 365/185.18 |
| 6,025,625 A | 2/2000 | Chi | |
| 6,515,344 B1 * | 2/2003 | Wollesen | 257/530 |
| 6,822,888 B2 | 11/2004 | Peng | |
| 6,882,574 B2 * | 4/2005 | Yang et al. | 365/185.29 |
| 6,930,002 B1 | 8/2005 | Chen et al. | |
| 2007/0109860 A1 * | 5/2007 | Lin et al. | 365/185.18 |

OTHER PUBLICATIONS

J.Peng, et al., "A Novel Embedded OTP NVM using Standard Foundry CMOS Logic Technology", Bernard Aronson, Kilopass, USA, p. 24, IEEE Non-Volatile Semiconductor Memory Workshop, 2006.

* cited by examiner

*Primary Examiner*—Andrew Q Tran
(74) *Attorney, Agent, or Firm*—Winston Hsu

(57) ABSTRACT

A method for operating a single-poly, single-transistor (1-T) non-volatile memory (NVM) cell. The NVM cell includes a gate on a P substrate, a gate dielectric layer, an N drain region and an N source region. N channel is defined between the N drain region and N source region. The NVM cell is programmed by breaking down the gate dielectric layer. To read the NVM cell, a positive voltage is provided to N drain region, a positive voltage is provided to the gate, and grounding the N source region and the P substrate.

14 Claims, 7 Drawing Sheets

METHOD FOR READING A SINGLE-POLY SINGLE-TRANSISTOR NON-VOLATILE MEMORY CELL

CROSS REFERENCE TO RELATED APPLICATIONS

This application claims priority from U.S. provisional application No. 60/745,193 filed Apr. 20, 2006.

BACKGROUND OF THE INVENTION

1. Field of the Invention

The present invention relates to a non-volatile memory device. In particular, the present invention relates to single-poly, one-transistor (1-T) one-time programmable (OTP) memory and a method to program and read such OTP memory.

2. Description of the Prior Art

Currently, non-volatile memory is one of the most popular electronic storage media for saving information. One of the most important features of all is that the information stored in the non-volatile memory will not disappear once the power supply is cut off. Generically speaking, memory devices such as hard drives, erasable programmable read-only memory (EPROM), electrically erasable programmable read-only memory (EEPROM) and flash memory are non-volatile memory devices, because all information is still available in the absence of power supply.

According to the programming times limit, non-volatile memory devices are divided into multi-time programmable memory (MTP) and one-time programmable memory (OTP).

MTP is multi-readable and multi-writable. For example, EEPROM and flash memory are designedly equipped with some corresponding electric circuits to support different operations such as programming, erasing and reading. Because OTP is one-time programmable only, it functions perfectly with electric circuits with mere programming and reading functions. Electric circuits for erasing operation are not required. Therefore, the electric circuits for OTP are much simpler than those for the MTP to minimize the production procedures and cost.

To enhance the applicability of OTP, the information stored in the OTP can be erased by the methods similar to those (such as UV light radiation) of EPROM. It is also suggested that OTP can be controlled to provide several times of reading and programming operations by simple circuit design.

Multi-time programmable memory units and one-time programmable memory units share similar stacking structures. Structurally speaking, they are divided into double-poly non-volatile memory and single-poly non-volatile memory. In the double-poly non-volatile memory, it usually comprises a floating gate for the storage of charges, an insulation layer (an ONO composite layer of silicon oxide/silicon nitride/silicon oxide for example), and a control gate for controlling the access of data. The operation of the memory unit is based on the principle of electric capacity, i.e. induced charges are stored in the floating gate to change the threshold voltage of the memory unit for determining the data status of "0" and "1".

On the other hand, in the advanced logic process, the embedding of double-poly non-volatile memory will greatly increase the cost and changes the electrical characteristics of devices because of additional thermal budget, followed by re-adjusting the characteristics of the devices back to origin device targets, so the schedule will be inevitably delayed. Consequently, single-poly non-volatile memory is advantageous and would be regarded as the embedded non-volatile memory of good competitiveness of the next generation.

Because the single-poly non-volatile memory is compatible with regular CMOS process, it is usually applied in the field of embedded memory, embedded non-volatile memory in the mixed-mode circuits and micro-controllers for example.

Please refer to U.S. Pat. No. 5,761,126 "SINGLE POLY EPROM CELL THAT UTILIZES A REDUCED PROGRAMMING VOLTAGE TO PROGRAM THE CELL", U.S. Pat. No. 6,930,002 "METHOD FOR PROGRAMMING SINGLE-POLY EPROM AT LOW OPERATION VOLTAGES", and U.S. Pat. No. 6,025,625 "SINGLE-POLY EEPROM CELL STRUCTURE OPERATIONS AND ARRAY ARCHITECTURE" for prior art regarding single-poly non-volatile memory.

The conventional single-poly non-volatile memory still has several disadvantages that need improvement. First, the conventional single-poly non-volatile memory occupies more chip area. So far, no solution is proposed for further miniaturizing the size of the single-poly one-time programmable memory with respect to the semiconductor logic process of 90 nm scale or beyond.

During the miniaturization of the logic process, all operational voltages and the thickness of the gate oxide shrink as well. In the 90 nm technology, for example, the thickest gate oxide layer is about 50 to 60 Å. It is a great challenge for the use of floating gate technique to produce multi-time programmable single-poly non-volatile memory for the reason that the insufficient tunnel oxide thickness deteriorates long term charge retention. On the other hand, it is not compatible with the current logic process to increase the thickness of the oxide layer.

Moreover, it requires higher voltage, at least 8 to 10 volts of couple well voltage for example, for the conventional single-poly non-volatile memory to generate enough electric field across the tunnel oxide layer for programming. Because the required operational voltage is much higher than the $V_{CC}$ voltage (for example supply voltage for input/output circuits $V_{CC}$=3.3V) supplied, it results in the serious problem of reliability for the gate oxide layers of tens of A in the more advanced nano-process. In addition, it also requires additional high voltage elements and corresponding electric circuits to generate the desired higher voltage.

U.S. Pat. No. 6,822,888 to Peng discloses a semiconductor memory cell having a data storage element constructed around an ultra-thin dielectric, such as a gate oxide. The semiconductor memory cell is used to store information by stressing the ultra-thin dielectric into breakdown (soft or hard breakdown) to set the leakage current level of the memory cell. The memory cell is read by sensing the current drawn by the cell. A suitable ultra-thin dielectric is high quality gate oxide of about 50 angstroms thickness or less, as commonly available from presently available advanced CMOS logic processes. Other references include "A Novel Embedded OTP NVM using Standard Foundry CMOS Logic Technology", Bernard Aronson, Kilopass, USA, pages 24-26, IEEE Non-Volatile Semiconductor Memory Workshop, 2006.

However, it requires one and half transistors (1.5-T), more specifically, one transistor and one capacitor, to constitute the semiconductor memory cell according to U.S. Pat. No. 6,822,888. Therefore, such memory cell occupies more chip area and the operation is more complicated.

SUMMARY OF THE INVENTION

It is one object of this invention to provide an operation method for reading or programming a single-poly, single-transistor NVM or OTP cell unit.

By employing the unique operation methods of this invention, the logic transistors of the chip can be used as an OTP memory device. Therefore, the advantages of this invention include simplified fabrication process and cost. When compared to the prior art, the present invention NVM device and operation method thereof can obtain much more On-Off current margin ($I_{ON}$-$I_{OFF}$ margin) during operation.

According the claimed invention, an operation method for reading a single-poly, single-transistor non-volatile memory (NVM) cell unit is disclosed. The single-poly, single-transistor NVM cell unit comprising a conductive gate disposed on a P well of a substrate, a gate dielectric layer between the conductive gate and the P well, an N type drain region, an N type source region, and an N channel between the N type drain region and the N type source region.

The operation method comprises:

electrically connecting the P well to a P well voltage $V_B$;

coupling the N type source region with the P well or providing a source voltage $V_S$ to the N type source region, wherein the source voltage $V_S$ is larger than the P well voltage $V_B$;

electrically connecting the N type drain region to a drain voltage VD that is relatively positive with respect to the P well voltage $V_B$ or the source voltage $V_S$; and electrically connecting the conductive gate to a gate voltage VG that is relatively positive with respect to the P well voltage $V_B$ to create strong inversion of the N channel;

wherein the single-poly, single-transistor NVM cell unit is not programmed and the N channel is completely turned on; wherein if the single-poly, single-transistor NVM cell unit is programmed to breakdown the gate dielectric layer and to hard breakdown status, the gate voltage $V_G$ will discharge through a leakage path formed in the gate dielectric layer whereby the gate voltage $V_G$ and the P well voltage $V_B$ will converge, and wherein when difference between the gate voltage $V_G$ and the P well voltage $V_B$ is less than one threshold voltage, the N channel will begin to turn off.

Major differences between the memory structure and operation methods disclosed in U.S. Pat. No. 6,822,888 (Peng) and this invention include: (1) the source taught by Peng is floating and is electrically isolated by shallow trench isolation, whereas in this invention the source is coupled to a pre-selected voltage; (2) the Peng's memory device is operated by reading the gate to P well and then to drain leakage current, and before breakdown, the no current flow is detected at the drain in read operation, while after breakdown, the small current flowing through the gate-P well-drain can be detected. In comparison with Peng, this invention is operated based on that the convergence between the gate voltage and the P well after breakdown, resulting in the very small turn-off current. However, before breakdown, this invention can supply so large turn-on current created by the channel strong inversion before breakdown. In light of the above, the present invention has increased $I_{ON}$-$I_{OFF}$ margin, higher reliability and simplified chip design.

According to another preferred embodiment, the operation method for a depletion mode single-poly, single transistor NVM cell unit comprises:

electrically connecting the conductive gate to a gate voltage $V_G$;

electrically connecting the N type source region to a source voltage $V_S$ that is relatively positive with respect to the gate voltage $V_G$;

electrically connecting the N type drain region to a drain voltage $V_D$ that is relatively positive with respect to the gate voltage $V_G$ and the source voltage $V_S$; and electrically connecting the P well to a P well voltage $V_B$ that is relatively positive with respect to the gate voltage $V_G$;

wherein if the single-poly, single-transistor NVM cell unit is not programmed, the N channel is turned off, wherein if the single-poly, single-transistor NVM cell unit has been programmed to break down the gate dielectric layer, the gate voltage $V_G$ will be charged through a leakage path formed in the gate dielectric layer whereby the gate voltage $V_G$ and the P well voltage $V_B$ will converge, and the N channel will be turned on.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a single-poly, single-transistor non-volatile memory cell unit structure and read operation method thereof, characterized in that the single-poly, single-transistor non-volatile memory cell unit of this invention is fully compatible with current advanced 90 nm semiconductor logic technology or beyond and thus has ability of miniature for the next generation memory device.

Figure 1:
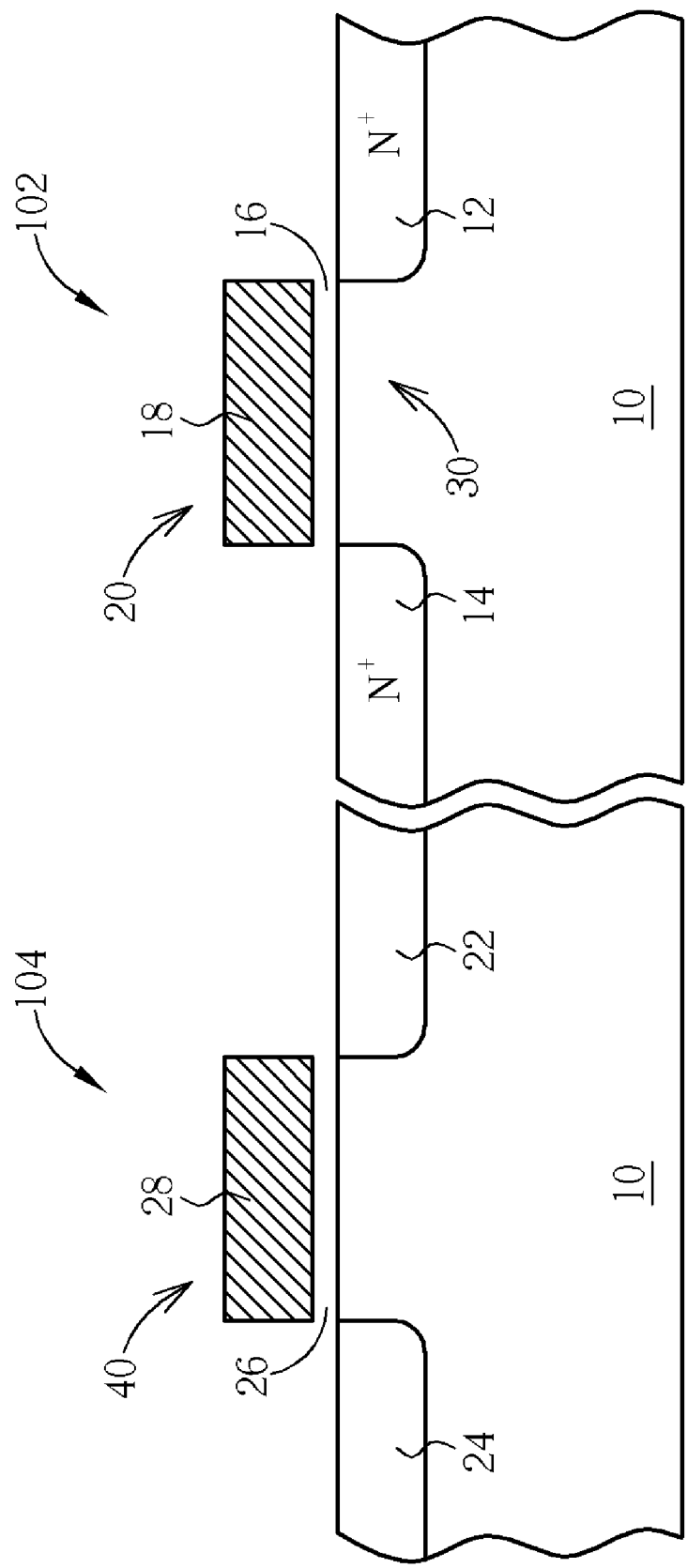
FIG. 1 is a schematic, cross-sectional diagram illustrating a single-poly, single-transistor non-volatile memory cell unit 20 in accordance with one preferred embodiment of this invention.

Please refer to FIG. 1. FIG. 1 is a schematic, cross-sectional diagram illustrating a single-poly, single-transistor non-volatile memory cell unit 20 in accordance with one preferred embodiment of this invention. As shown in FIG. 1, the single-poly, single-transistor non-volatile memory cell unit 20 is disposed within a memory array region 102 of a chip and comprises a conductive gate 18 disposed on a P well 10 of a substrate, a gate dielectric layer 16 between the conductive gate 18 and the P well 10, an N type drain region 12 and an N type source region 14. An N channel 30 is situated between the N type drain region 12 and the N type source region 14.

The substrate may include but not limited to semiconductor substrate, SOI substrate or TFT glass substrate.

For the sake of simplicity, in the following context and in the figures, the single-poly, single-transistor non-volatile memory cell unit 20 will be presented as an NMOS transistor.

According to the preferred embodiment of this invention, the gate dielectric layer 16 is silicon dioxide that is grown on the P well 10 of the substrate by, for example, thermal oxidation methods, but not limited thereto. Other suitable gate dielectric materials may be employed, for example, oxide-nitride-oxide (ONO) or other compound silicon oxide. The conductive gate 18 may comprise doped polysilicon, but not limited thereto. Further, a silicide (not shown) may be formed on the conductive gate 18 or on the drain or source region in order to reduce contact resistance.

Within a logic area 104 of the same chip, a single-poly transistor 40 is provided. The single-poly transistor 40 comprises a conductive gate 28 on the well 10, a gate dielectric layer 26 between the conductive gate 28 and the well 10, a drain region 22 and a source region 24, wherein the drain region 22 and source region 24 may be both N type doped or both P type doped.

The single-poly, single-transistor non-volatile memory cell unit 20 and the single-poly transistor 40 may be electrically isolated from each other with a shallow trench isolation (STI) structure (not shown), but not limited thereto.

The gate dielectric layer 16 of the single-poly, single-transistor non-volatile memory cell unit 20 has a thickness that is substantially equal to that of the gate dielectric layer 26 of the single-poly transistor 40 within the logic area 104 and the gate dielectric layers 16 and 26 are fabricated in the same gate oxide forming step.

As shown in FIG. 1, the present invention features that the single-poly, single-transistor non-volatile memory cell unit 20 and the single-poly transistor 40 within the logic area 104 have substantially the same structure. In other words, a part of the single-poly transistor 40 within the logic area 104 may act as the single-poly, single-transistor non-volatile memory cell unit 20 and function as one-time programmable memory.

Such novel scheme is a meaningful breakthrough for the integration of the non-volatile memory and the next-generation logic process and is not yet disclosed or employed by anyone in this industry. To enable and practice the above novel scheme, it requires a unique operation method of this invention, which will be now described in detail in accompany with the drawings.

FIG. 2 to FIG. 6 are schematic diagrams demonstrating the unique write and read operation methods with respect to the above-described single-poly, single-transistor non-volatile memory cell unit 20 in accordance with the preferred embodiment of this invention.

Figure 2:
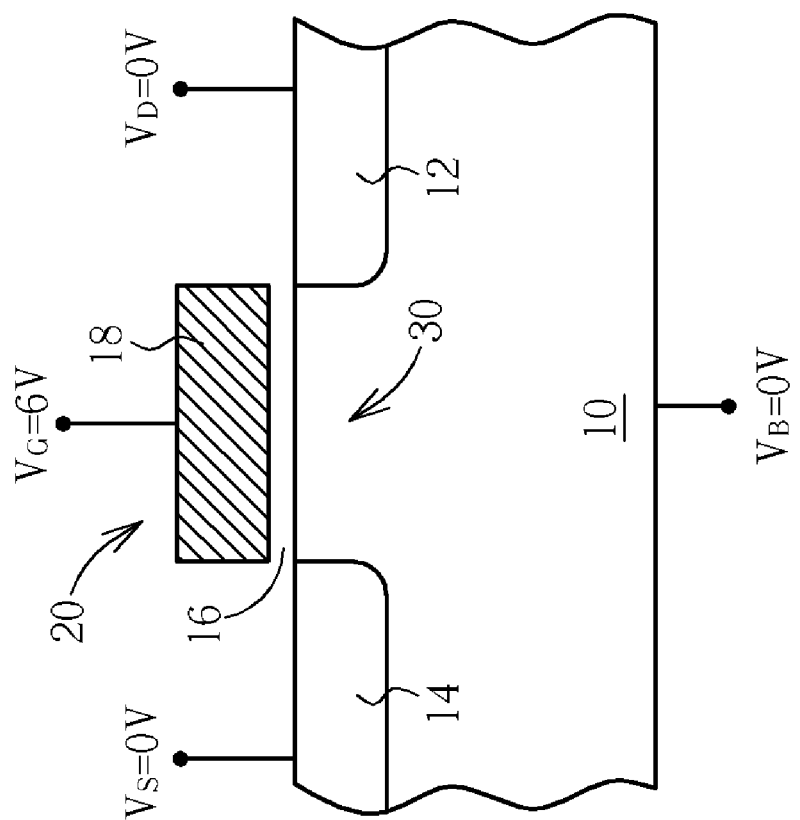
FIG. 2 is a schematic diagram demonstrating the write operation method of the single-poly, single-transistor non-volatile memory cell unit 20 according to this invention.

Please first refer to FIG. 2. FIG. 2 is a schematic diagram demonstrating the write operation method of the single-poly, single-transistor non-volatile memory cell unit 20 according to this invention. As shown in FIG. 2, the single-poly, single-transistor non-volatile memory cell unit 20 comprises conductive gate 18, gate dielectric layer 16 between the P well 10 and the conductive gate 18, N type drain region 12 and N type source region 14. An N channel 30 is defined between the N type drain region 12 and N type source region 14.

During the program operation, in accordance with the preferred embodiment of this invention, the N type drain region 12, N type source region 14 and the P well 10 of the substrate are all grounded ($V_D=V_S=V_B=0V$), the conductive gate 18 is coupled to a positive gate voltage $V_G$, for example, $V_G=6V$. By doing this, the gate dielectric layer 16 of the single-poly, single-transistor non-volatile memory cell unit 20 breaks down preferably to an extent of so-called hard breakdown (HBD) status.

After that the gate dielectric layer 16 breaks down due to write or program operation, such breakdown gate dielectric layer 16 will act as a resistor. The mechanism of the breakdown of the gate dielectric layer 16 is not quite clear yet, however, it is believed that the trap defects inside the gate dielectric layer 16 are relevant. When the gate dielectric layer 16 is damaged to the so-called hard breakdown (HBD) status, silicon filaments extending the thickness of the gate dielectric layer 16 may be formed.

Figure 3:
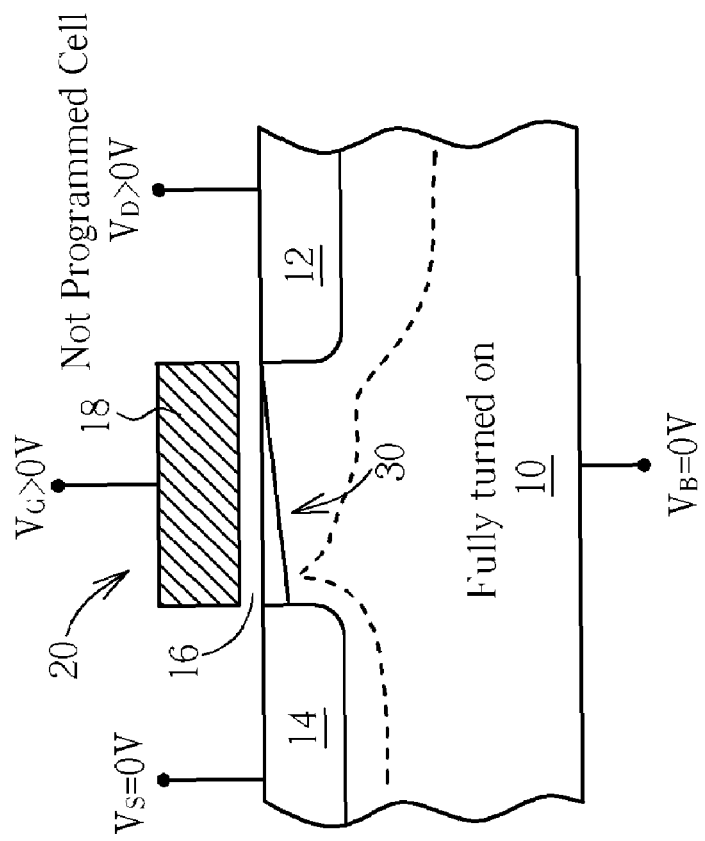
FIG. 3 is a schematic diagram (taking NMOS as an example) demonstrating the method of reading the single-poly, single-transistor non-volatile memory cell unit 20 that is not programmed in accordance with the preferred embodiment of this invention.
Figure 4:
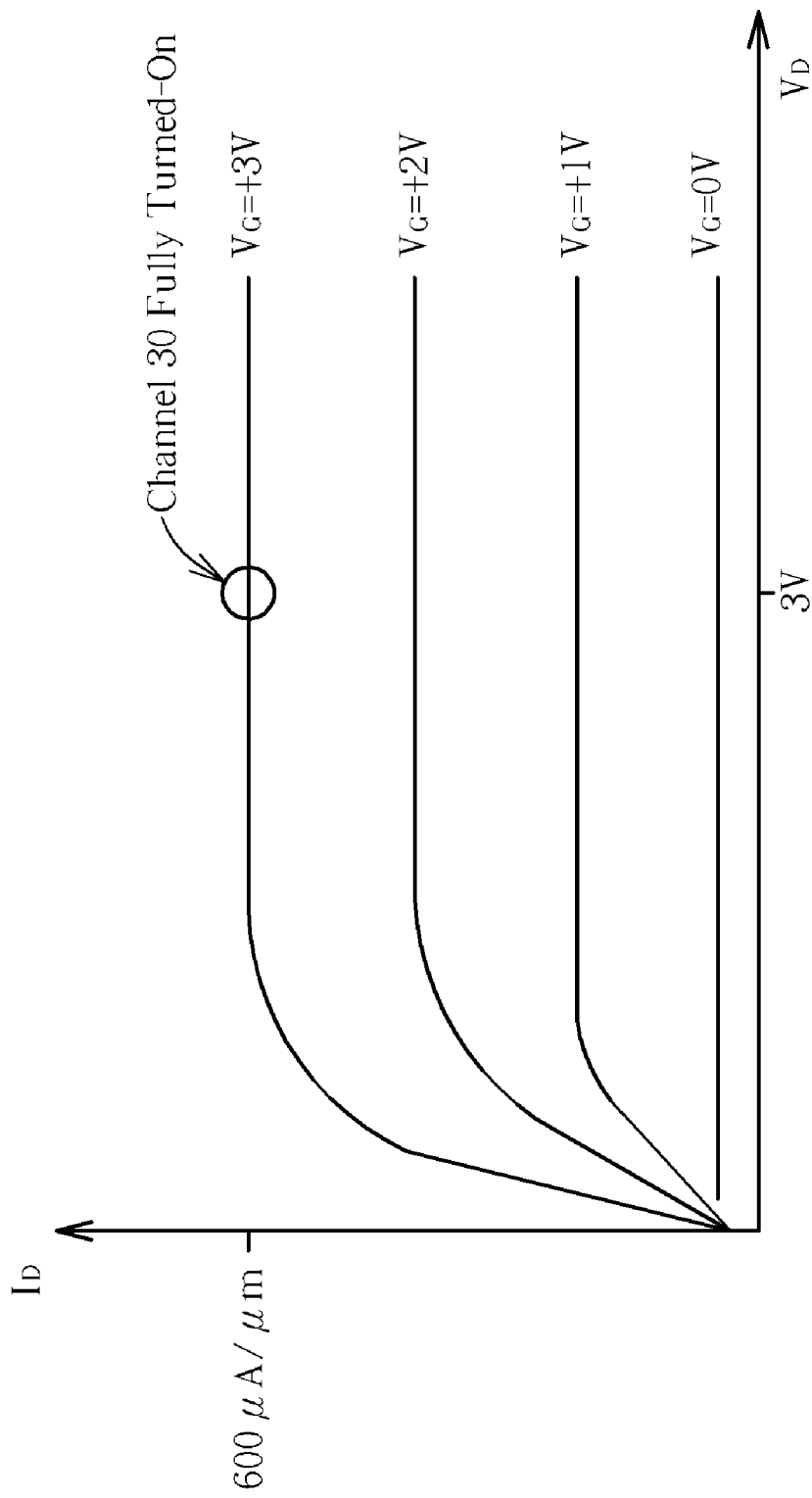
FIG. 4 is a plot demonstrating $I_D$ (drain current) vs. $V_D$ (drain voltage) behavior under different gate voltages in the read operation according to this invention.

Please refer to FIG. 3 and FIG. 4. FIG. 3 is a schematic diagram (taking NMOS as an example) demonstrating the method of reading the single-poly, single-transistor non-volatile memory cell unit 20 that is not programmed in accordance with the preferred embodiment of this invention. FIG. 4 is a plot demonstrating $I_D$ (drain current) vs. $V_D$ (drain voltage) behavior under different gate voltages in the read operation according to this invention.

As shown in FIG. 3, the N channel 30 of the single-poly, single-transistor non-volatile memory cell unit 20 has been treated by ion implantation to adjust the threshold voltage ($V_{th}$) thereof. For example, the threshold voltage is adjusted to $V_{th}=0.8\sim1V$. The aforesaid threshold voltage adjustment of the memory cell unit may be carried out concurrently with the threshold voltage adjustment of transistors within the logic area 104. During the read operation, according to this invention, the N type drain region 12 is electrically connected to a positive voltage $V_D$, for example, $V_D=3V$, the N type source region 14 and the P well 10 of the substrate are both grounded ($V_S=V_B=0V$), and the conductive gate 18 is electrically connected to a positive gate voltage $V_G$, for example, $V_G=3V$.

Under the aforesaid read conditions, the N channel 30 of the exemplary NMOS single-poly, single-transistor non-volatile memory cell unit 20 is completely turned on, as shown in FIG. 4, with a drain current $I_D$ as high as about 600 uA/um.

Figure 5:
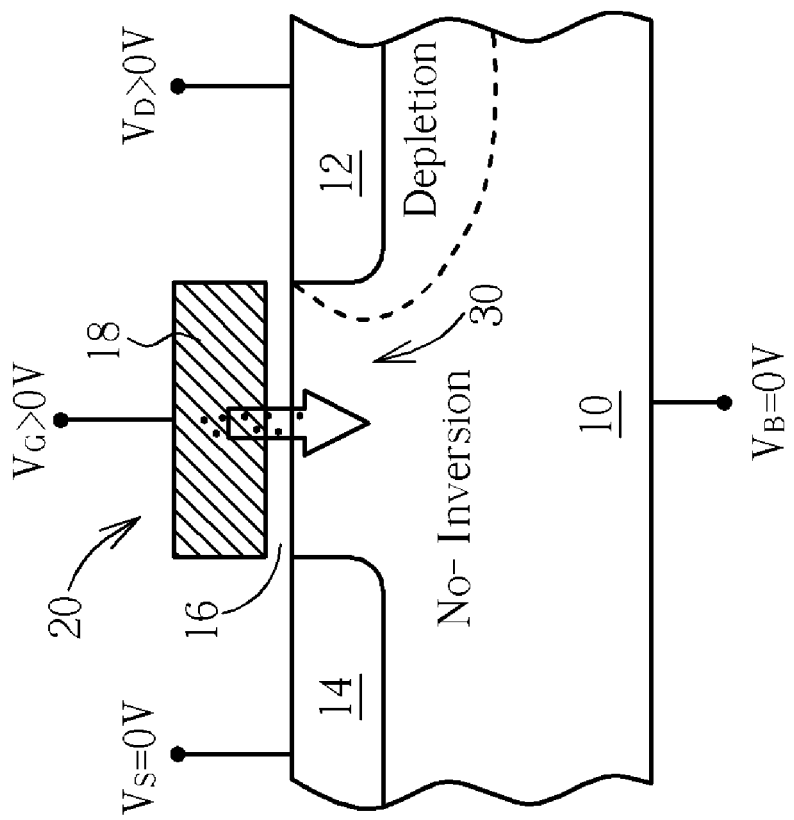
FIG. 5 is a schematic diagram (taking NMOS as an example) demonstrating the method of reading the single-poly, single-transistor non-volatile memory cell unit 20 that has been programmed in accordance with the preferred embodiment of this invention.
Figure 6:
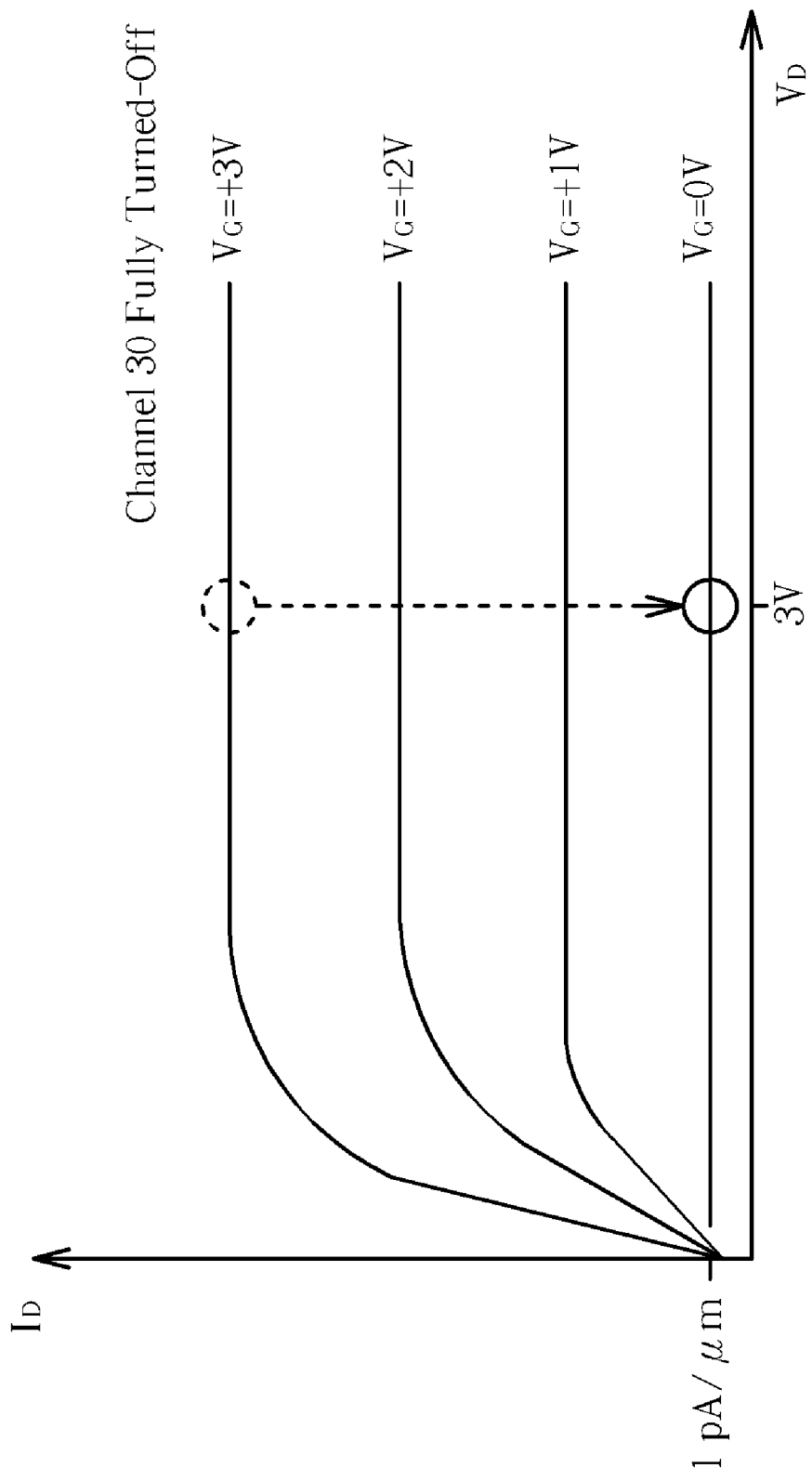
FIG. 6 is a plot demonstrating $I_D$ (drain current) vs. $V_D$ (drain voltage) behavior under different gate voltages in the read operation according to this invention.

Please refer to FIG. 5 and FIG. 6. FIG. 5 is a schematic diagram (taking NMOS as an example) demonstrating the method of reading the single-poly, single-transistor non-volatile memory cell unit 20 that has been programmed in accordance with the preferred embodiment of this invention. FIG. 6 is a plot demonstrating $I_D$ (drain current) vs. $V_D$ (drain voltage) behavior under different gate voltages in the read operation according to this invention.

As shown in FIG. 5, likewise, the N channel 30 of the single-poly, single-transistor non-volatile memory cell unit 20 has been treated by ion implantation to adjust the threshold voltage ($V_{th}$) thereof. For example, the threshold voltage is adjusted to $V_{th}=0.8\sim1V$. The aforesaid threshold voltage adjustment of the memory cell unit may be carried out concurrently with the threshold voltage adjustment of transistors within the logic area 104. When reading single-poly, single-transistor non-volatile memory cell unit 20 that has been programmed, the N type drain region 12 is electrically connected to a positive voltage $V_D$, for example, $V_D=3V$, the N type source region 14 and the P well 10 of the substrate are both grounded ($V_S=V_B=0V$), and the conductive gate 18 is electrically connected to a positive gate voltage $V_G$, for example, $V_G=3V$.

Since the gate dielectric layer 16 has been programmed by strong passing-through gate current and is thus in so-called hard breakdown (HBD) status, under the aforesaid read conditions, the gate dielectric layer 16 functions as a substantially conduction (or leakage) path between the conductive gate 18 and the P well 10 of the substrate of the NMOS single-poly, single-transistor non-volatile memory cell unit 20. The gate voltage will be gradually in concord with and close to the P well voltage $V_B$ because the leakage path in the gate dielectric layer. When the voltage difference between the gate voltage $V_G$ and the P well voltage $V_B$ is less than one threshold voltage $V_{th}$, the N channel 30 will be completely turned off, as shown in FIG. 6, with a turned-off drain current of about 1 pA/um.

In light of the above, the aforesaid unique read operation method of this invention allows much more On-Off current margin ($I_{ON}$-$I_{OFF}$ margin~600 uA/um) when in operation, which is at least 10 times the On-Off current margin of the prior art NVM technology (<60 uA/um). This, to the circuit designers, can greatly simplify the complexity of circuit design and also improve the reliability of the NVM device in terms of charge retention ability.

Figure 7:
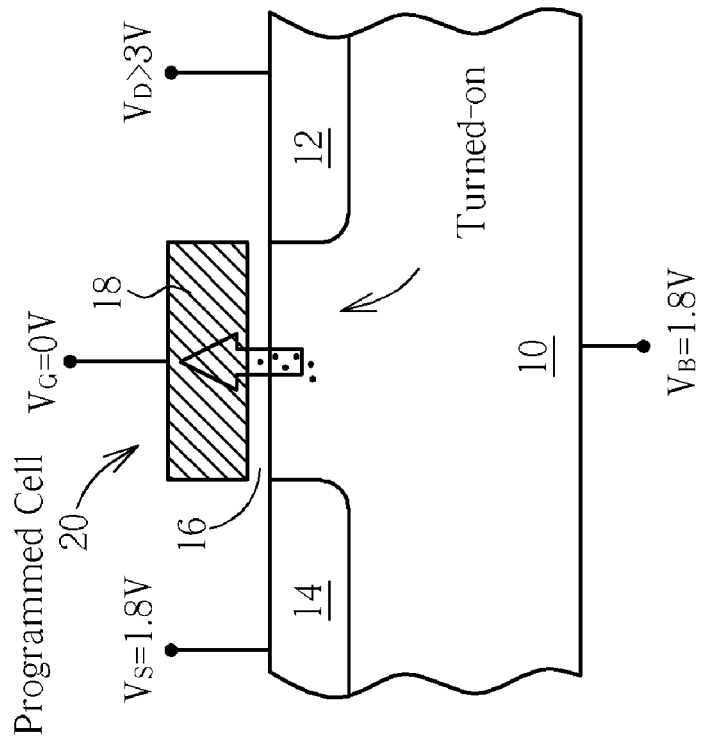
FIG. 7 is a schematic diagram (still taking NMOS as an example) demonstrating the method of reading the single-poly, single-transistor non-volatile memory cell unit 20 that has been programmed in accordance with a second preferred embodiment of this invention.

Please refer to FIG. 7. FIG. 7 is a schematic diagram (still taking NMOS as an example) demonstrating the method of reading the single-poly, single-transistor non-volatile memory cell unit 20 that has been programmed in accordance with a second preferred embodiment of this invention. As shown in FIG. 7, the threshold voltage of the N channel 30 of the single-poly, single-transistor non-volatile memory cell unit 20 is not adjusted. Therefore, the single-poly, single-transistor non-volatile memory cell unit 20 in this case is a depletion-mode NMOS and has a threshold voltage $V_{th}$ is close to 0V or $V_{th}$<0V. To form such cell, for example, when implementing the ion implantation to adjust the threshold voltage of the transistors within the logic area 104, a portion of the transistors may be selected as memory cells and are masked from the threshold voltage ion implantation. Alternatively, a counter doping may be carried out to transfer the selected NMOS cell from Enhancement Mode to the Depletion Mode.

When reading single-poly, single-transistor non-volatile memory cell unit 20 that has been programmed, for example, the N type drain region 12 is electrically connected to a positive voltage $V_D$, for example, $V_D$=3V, the N type source region 14 is electrically connected to a positive voltage $V_D$, for example, $V_S$=1.8V, the P well 10 of the substrate is electrically connected to a positive voltage $V_B$, for example, $V_B$=1.8V, and the conductive gate 18 is grounded ($V_G$=0V). It is noted that in a case that the single-poly, single-transistor non-volatile memory cell unit 20 is not programmed, since the gate to P well bias is negative ($V_G$-$V_B$=-1.8V), hence the N channel 30 will not be turned on and the drain current $I_D$ has only about 1 pA/um.

According to the second preferred embodiment, the single-poly, single-transistor non-volatile memory cell unit 20 has been programmed, i.e., the gate dielectric layer 16 is altered by strong passing-through gate current and is thus in so-called hard breakdown (HBD) status, the gate voltage will now be gradually charged through the gate dielectric layer 16 such that the gate voltage and the P well voltage will converge. When the gate voltage and the P well voltage converge, the N channel 30 will be completely turned on. Under the aforesaid read conditions, since the conduction path between the conductive gate 18 and the P well 10 of the substrate, the gate 18 to P well 10 bias is approximately 0V, such that the N channel 30 is fully turned on with a drain current of about hundreds of micro amps per micrometer (uA/um).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operation method for reading a single-poly, single-transistor non-volatile memory (NVM) cell unit, the single-poly, single-transistor NVM cell unit comprising a conductive gate disposed on a P well of a substrate, a gate dielectric layer between the conductive gate and the P well, an N type drain region, an N type source region, and an N channel between the N type drain region and the N type source region, the operation method comprising:

electrically connecting the P well to a P well voltage $V_B$;

coupling the N type source region with the P well or providing a source voltage $V_S$ to the N type source region, wherein the source voltage $V_S$ is larger than the P well voltage $V_B$;

electrically connecting the N type drain region to a drain voltage $V_D$ that is relatively positive with respect to the P well voltage $V_B$ or the source voltage $V_S$; and electrically connecting the conductive gate to a gate voltage VG that is relatively positive with respect to the P well voltage $V_B$ to create strong inversion of the N channel;

wherein when the single-poly, single-transistor NVM cell unit is not programmed, the N channel is completely turned on; wherein when the single-poly, single-transistor NVM cell unit is programmed to breakdown the gate dielectric layer, the gate voltage $V_G$ will discharge through a leakage path formed in the gate dielectric layer whereby the gate voltage $V_G$ and the P well voltage $V_B$ will converge, and wherein when the difference between the gate voltage $V_G$ and the P well voltage $V_B$ is less than one threshold voltage, the N channel will begin to turn off.

2. The operation method according to claim 1 wherein, before reading, the threshold voltage of the N channel has been adjusted by using an ion implantation.

3. The operation method according to claim 2 wherein the threshold voltage of the N channel has been adjusted to $V_{th}$=0.8~1V.

4. The operation method according to claim 1 wherein in read operation, a drain current ID is as high as about 600 uA/um when the N channel is completely turned on.

5. The operation method according to claim 1 wherein in read operation, a drain current ID is as low as about 1 pA/um when the N channel is completely turned off.

6. The operation method according to claim 1 wherein the drain voltage $V_D$=3V and the gate voltage $V_G$=3V.

7. The operation method according to claim 1 wherein the substrate comprises semiconductor substrate, SOI substrate or TFT glass substrate.

8. An operation method for reading a single-poly, single-transistor non-volatile memory (NVM) cell unit, the single-poly, single-transistor NVM cell unit being a depletion-mode device and comprising a conductive gate disposed on a P well of a substrate, a gate dielectric layer between the conductive gate and the P well, an N type drain region, an N type source region, and an N channel between the N type drain region and the N type source region, the operation method comprising:

electrically connecting the conductive gate to a gate voltage $V_G$;

electrically connecting the N type source region to a source voltage $V_S$ that is relatively positive with respect to the gate voltage $V_G$;

electrically connecting the N type drain region to a drain voltage $V_D$ that is relatively positive with respect to the gate voltage $V_G$ and the source voltage $V_S$; and electrically connecting the P well to a P well voltage $V_B$ that is relatively positive with respect to the gate voltage $V_G$;

wherein when the single-poly, single-transistor NVM cell unit is not programmed, the N channel is turned off, wherein when the single-poly, single-transistor NVM cell unit has been programmed to break down the gate dielectric layer, the gate voltage $V_G$ will be charged through a leakage path formed in the gate dielectric layer whereby the gate voltage $V_G$ and the P well voltage $V_B$ will converge, and the N channel will be turned on.

9. The operation method according to claim 8 wherein the threshold voltage $V_{th}$ of the N channel of the single-poly, single-transistor NVM cell unit is either adjusted or transferred into the depletion-mode device by means of counter doping.

10. The operation method according to claim 9 wherein the threshold voltage $V_{th}$ is close to 0V or $V_{th}$<0V.

11. The operation method according to claim 8 wherein read drain current $I_D$ is as high as about 600 uA/um when the N channel is turned on.

12. The operation method according to claim 8 wherein read drain current $I_D$ is as low as about 1 pA/um when the N channel is turned off.

13. The operation method according to claim 8 wherein $V_D$=3V, $V_S$=1.8V and $V_B$=1.8V.

14. The operation method according to claim 8 wherein the substrate comprises semiconductor substrate, SOI substrate or TFT glass substrate.

* * * * *